(12) United States Patent
Hsu et al.

(10) Patent No.: US 9,685,749 B1
(45) Date of Patent: Jun. 20, 2017

(54) CABLE LIMITING DEVICE AND SERVER THEREOF

(71) Applicants: Inventec (Pudong) Technology Corp., Shanghai (CN); Inventec Corporation, Taipei (TW)

(72) Inventors: Shun-Cheng Hsu, Taipei (TW); Yung-Chen Lin, Taipei (TW); Chi-Cheng Chia, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 15/080,601

(22) Filed: Mar. 25, 2016

(30) Foreign Application Priority Data

Nov. 30, 2015 (CN) .......................... 2015 1 0854529

(51) Int. Cl.
| | |
|---|---|
| *H05K 1/00* | (2006.01) |
| *H01R 33/74* | (2006.01) |
| *H05K 7/14* | (2006.01) |
| *H01R 12/72* | (2011.01) |

(52) U.S. Cl.
CPC .......... *H01R 33/74* (2013.01); *H01R 12/721* (2013.01); *H05K 7/1489* (2013.01); *H05K 7/1491* (2013.01)

(58) Field of Classification Search
CPC .... H01R 33/74; H01R 12/721; H05K 7/1489; H05K 7/1491
USPC ...... 361/748, 807, 809, 810, 679.01–679.02, 361/679.31–679.33, 679.37, 679.39, 784, 361/785, 788, 724–276; 439/55, 59, 61, 439/78–79, 108, 502, 505; 174/50, 59, 174/520, 542, 559

See application file for complete search history.

(56) References Cited

U.S. PATENT DOCUMENTS

| | | | | |
|---|---|---|---|---|
| 9,386,723 | B2 * | 7/2016 | Kostecka | ................. H04Q 1/06 |
| 9,585,280 | B2 * | 2/2017 | Wuerstlein | ........... H05K 7/1427 |
| 2003/0029580 | A1 * | 2/2003 | Wright | .................... E05D 13/10 160/201 |
| 2009/0147495 | A1 * | 6/2009 | Hetzer | ..................... H04Q 1/13 361/823 |
| 2012/0217054 | A1 * | 8/2012 | Zhang | .................... G06F 1/183 174/520 |
| 2016/0033722 | A1 * | 2/2016 | Ray | ...................... G02B 6/4471 385/135 |
| 2016/0356045 | A1 * | 12/2016 | Fenske | ..................... E04C 5/12 |

* cited by examiner

*Primary Examiner* — Hung S Bui
(74) *Attorney, Agent, or Firm* — Winston Hsu

(57) ABSTRACT

A cable limiting device is for connecting to a connection device of a server. The connection device includes a motherboard, a bridgeboard, and a port disposed on the bridgeboard and coupled to the motherboard. The cable limiting device includes a side plate having a longitudinal opening and a transverse slot communicated with each other, a casing, and a cable fixed in the casing. A pillar of the casing passes through the longitudinal opening to be slidably disposed through the transverse slot and be movable relative to the transverse slot for making the casing away from or close to the side plate. When the cable is connected to the port, the casing is away from or close to the side plate with movement of the pillar in the transverse slot for guiding a gold-plated terminal of the cable to be inserted into the port and establishing signal transmission via the bridgeboard.

10 Claims, 8 Drawing Sheets

CABLE LIMITING DEVICE AND SERVER THEREOF

BACKGROUND OF THE INVENTION

1. Field of the Invention

The present invention relates to a cable limiting device and a server thereof, and more specifically, to a cable limiting device for establishing high speed signal transmission between a motherboard and a switchable device via connection among a first cable coupled to the motherboard, a bridgeboard spaced from the motherboard, and a second cable coupled to the switchable device and a server thereof.

2. Description of the Prior Art

With development of electronic technology, a server has been widely used as an information processing system. The server usually includes a motherboard, a power supply, disk drives (e.g. hard disk drive or optical disk drive) and so on. Since the server has developed many functions and has become smaller and smaller in practical application, there are more and more motherboards installed in the server. However, request for the hot plugging function of the mother board and the complicated wiring layout for electrical components in the limited space of the motherboard cause a high design and manufacturing cost of the server.

Furthermore, the motherboard usually utilizes a board-to-board connector to be inserted into a middle plane, and then is electrically connected to a hard disk drive of the server via connection between a port on the middle plane and a cable. However, the aforesaid connection design not only causes a time-consuming and strenuous assembly process, but also results in a long signal transmission path since the printed wiring on the motherboard needs to pass through the middle plane, so that the high speed signal transmission between the motherboard and the hard disk drive could be attenuated easily and influenced by other signal transmission on the middle plane.

SUMMARY OF THE INVENTION

The present invention provides a cable limiting device for connecting to a connection device of a server. The connection device includes a motherboard, a bridgeboard, and a port. The port is disposed on the bridgeboard and coupled to the motherboard in a cable connection manner. The cable limiting device includes a side plate, a casing, and a cable. The side plate has a longitudinal opening and a transverse slot communicated with the longitudinal opening. The casing has a pillar protruding toward a side of the side plate. The pillar passes through the longitudinal opening to be slidably disposed through the transverse slot and be movable relative to the transverse slot for making the casing away from or close to the side plate. The cable is fixed in the casing. The cable has a gold-plated terminal. When the cable is connected to the port, the casing is away from or close to the side plate with movement of the pillar in the transverse slot for guiding the gold-plated terminal to be inserted into the port and establishing signal transmission via the bridgeboard.

The present invention further provides a server including a connection device, a cable limiting device, and at least one switchable device. The connection device includes a motherboard, a bridgeboard, a port, and a first cable. The port is disposed on the bridgeboard. The first cable is coupled to the bridgeboard and the motherboard. The cable limiting device includes a tray, a casing, and a second cable. The tray has at least one side plate. The at least one side plate has a longitudinal opening and a transverse slot communicated with the longitudinal opening. The casing has a pillar protruding toward a side of the at least one side plate and an elastic arm formed at a side of the pillar. The pillar passes through the longitudinal opening to be slidably disposed through the transverse slot and be movable relative to the transverse slot for making the casing away from or close to the at least one side plate. The pillar has a sliding travel in the transverse slot. An engaging member protrudes from a position of the elastic arm corresponding to the transverse slot. The at least one side plate presses the engaging member to deform the elastic arm when the pillar passes through the longitudinal opening to enter the transverse slot. The deformed elastic arm provides an elastic force to make the engaging member spring out of the transverse slot so as to be engaged with a front end of the transverse slot when the pillar moves over the sliding travel toward a rear end of the transverse slot in the transverse slot to make the engaging member aligned with the transverse slot. The second cable is fixed in the casing. The second cable has a gold-plated terminal. The at least one switchable device is disposed on the tray and coupled to the second cable. When the second cable is connected to the port, the casing is away from or close to the at least one side plate with movement of the pillar in the transverse slot for guiding the gold-plated terminal to be inserted into the port and establishing signal transmission between the at least one switchable device and the motherboard via the bridgeboard and the first cable.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
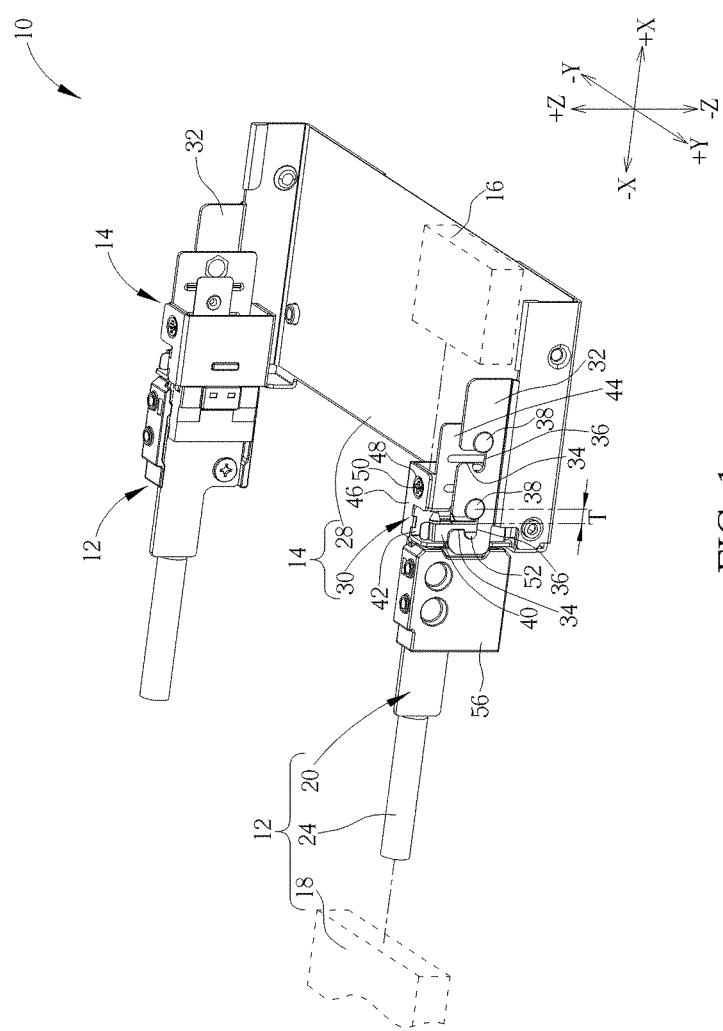
FIG. 1 is a diagram of a server according to an embodiment of the present invention.

Please refer to FIG. 1, which is a diagram of a server 10 according to an embodiment of the present invention. As shown in FIG. 1, the server 10 includes at least one connection device 12, at least one cable limiting device 14, and at least one switchable device 16 (one shown in FIG. 1, but not limited thereto). The switchable device 16 is briefly depicted by dotted lines in FIG. 1. There are two connection devices 12 and two cable limiting devices 14 shown in FIG. 1, but not limited thereto. More detailed description for the connection device 12, the cable limiting device 14 and the switchable device 16 located at a side of the sever 10 in FIG. 1 is provided as follows. As for the related description for the connection device 12, the cable limiting device 14 and the switchable device 16 located at another side of the sever 10 in FIG. 1, it could be reasoned by analogy and omitted herein.

Figure 2:
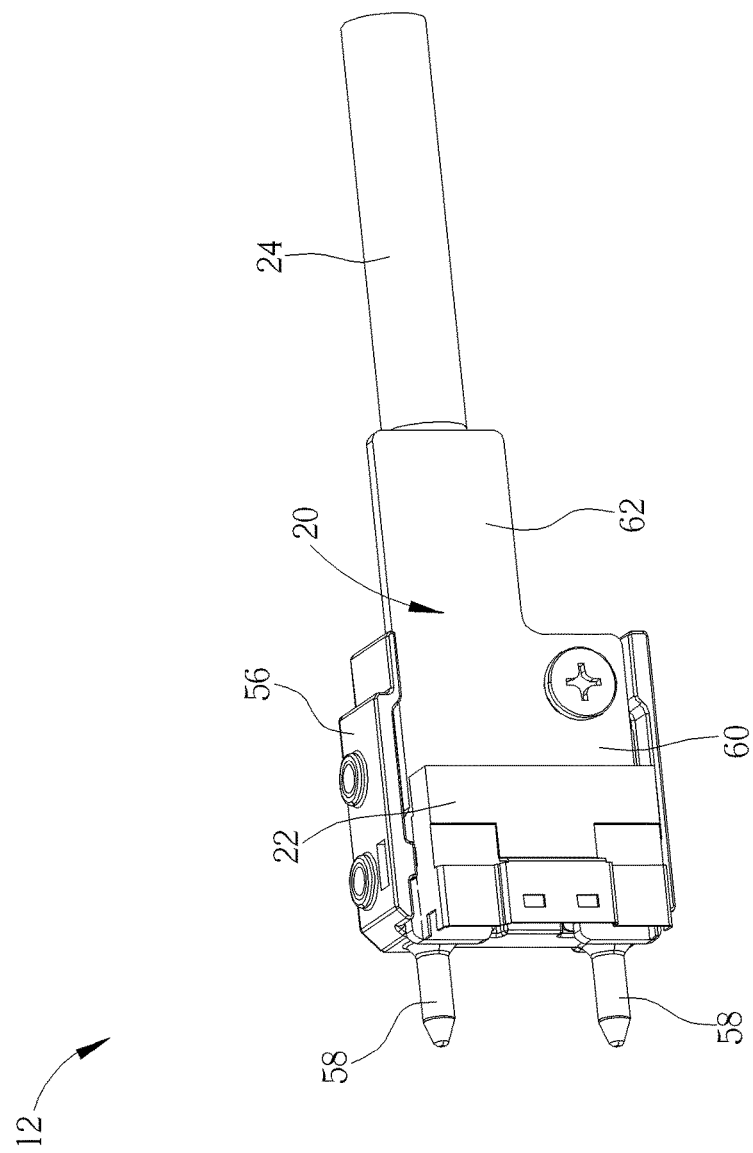
FIG. 2 is a partial enlarged diagram of a connection device in FIG. 1.
Figure 3:
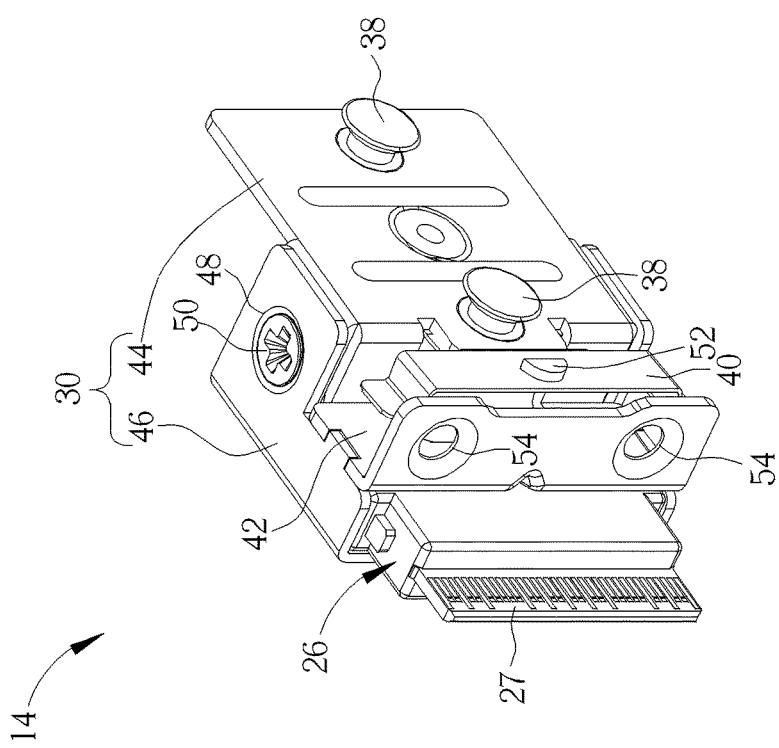
FIG. 3 is a partial enlarged diagram of a cable limiting device in FIG. 1.
Figure 4:
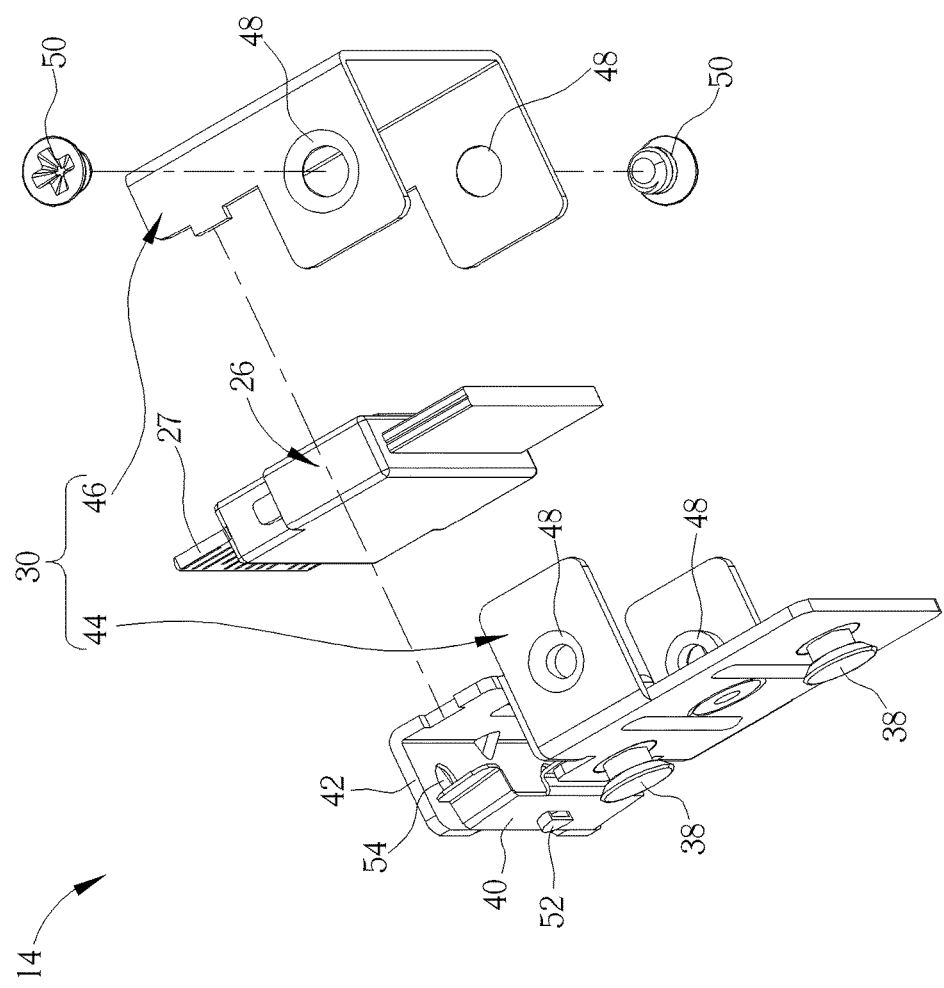
FIG. 4 is an exploded diagram of the cable limiting device in FIG. 3.

Please refer to FIG. 1, FIG. 2, FIG. 3, and FIG. 4. FIG. 2 is a partial enlarged diagram of the connection device 12 in FIG. 1. FIG. 3 is a partial enlarged diagram of the cable limiting device 14 in FIG. 1. FIG. 4 is an exploded diagram of the cable limiting device 14 in FIG. 3. As shown in FIGS. 1-4, the connection device 12 includes a motherboard 18 (briefly depicted by dotted lines in FIG. 1), a bridgeboard 20, a port 22, and a first cable 24. The cable limiting device 14 includes a second cable 26, a tray 28, and a casing 30. The port 22 is disposed on the bridgeboard 20. The first cable 24 is electrically connected to the bridgeboard 20 and the motherboard 18. The second cable 26 is fixed in the casing 30 and has a gold-plated terminal 27. The switchable device 16 is disposed on the tray 28 and is electrically connected to the second cable 26. In this embodiment, the switchable device 16 could be preferably a hard disk drive, but not limited thereto. The port 22 could be correspondingly an HDD (Hard Disk Drive) signal port (e.g. a mini Serial Attached SCSI (mini SAS) port, but not limited thereto). The gold-plated terminal 27 could be correspondingly an HDD signal terminal (e.g. a mini SAS terminal, but not limited thereto). Accordingly, when the port 22 is connected to the second cable 26, the switchable device 16 could be electrically connected to the connection device 12 via the cable limiting device 14, so as to establish high speed signal transmission between the switchable device 16 and the motherboard 18.

More detailed description for the structural designs of the connection device 12 and the cable limiting device 14 is provided as follows. As shown in FIG. 1, FIG. 2, FIG. 3, and FIG. 4, the tray 28 has at least one sideplate 32 (two shown in FIG. 1, but not limited thereto). At least one longitudinal opening 34 and at least one transverse slot 36 (two longitudinal openings 34 and two transverse slots 36 shown in FIG. 1, but not limited thereto). The longitudinal opening 34 is communicated with the transverse slot 36. At least one pillar 38 protrudes from the casing 30 toward the side plate 32 (two shown in FIG. 1, but not limited thereto) and an elastic arm 40 is formed at a side of the pillar 38. The pillar 38 could be preferably a T-shaped guide pillar (but not limited thereto, meaning that the present invention could adopt other limiting structural design, such as a bending guide pillar) to be movable relative to the transverse slot 36 when passing through the longitudinal opening 34 to be sildably disposed through the transverse slot 36, so as to make the casing 30 close to or away from the side plate 32. That is to say, the casing 30 could perform limited movement in a ±Y-axis direction as shown in FIG. 1 via the pillar 38 being disposed through the transverse slot 36, so as to guide the gold-plated terminal 27 to be inserted into the port 22.

Furthermore, in this embodiment, the casing 30 could further have a containing slot 42. An elastic arm 40 is formed at a side of the containing slot 42 facing the pillar 38 for increasing the structural elasticity of the elastic arm 40. To be more specific, the casing 30 could include a first frame 44 and a second frame 46. The first frame 44 and the second frame 46 are disposed at two sides of the second cable 26 for fixing the second cable 26. The pillar 38 is formed at a side of the first frame 44 facing the side plate 32. The present invention could preferably adopt a screw locking method (but not limited thereto, meaning that the present invention could adopt other frame fixing method, such as a structural engagement method) to fixing the first frame 44 to the second frame 46. For example, as shown in FIG. 4, a plurality of holes 48 (two shown in FIG. 4, but not limited thereto) is formed on two sides of the first frame 44 and two sides of the second frame 46 respectively. Two screws 50 are screwed into the holes 48 of the first frame 44 and the holes 48 of the second frame 46 for fixing the second cable 26 between the first frame 44 and the second frame 46.

As for the design for fixing the casing 30 to the side plate 32, as shown in FIG. 1, the pillar 38 has a sliding travel T in the transverse slot 36. An engaging member 52 protrudes from a position of the elastic arm 40 corresponding to the transverse slot 36. Accordingly, the casing 30 could be fixed to the side plate 32 by the engaging member 52 being engaged with the transverse slot 36 and the pillar 38 abutting against the transverse slot 36, so that movement of the casing 30 toward a ±X-axis direction and a ±Z-axis direction as shown in FIG. 1 could be constrained.

In practical application, as shown in FIG. 2 and FIG. 3, a plurality of guide holes 54 (two shown in FIG. 3, but not limited thereto) is formed on a side of the containing slot 42. The connection device 12 could further include a holding base 56 for holding the bridgeboard 20 and the port 22. A plurality of guide pins 56 protrudes from the holding base 54 corresponding to the plurality of guide holes 54. Accordingly, when the second cable 26 is connected to the port 22, the guide pin 58 is disposed through the guide hole 54 so as to guide the gold-plated terminal 27 to be inserted into the port 22.

Figure 5:
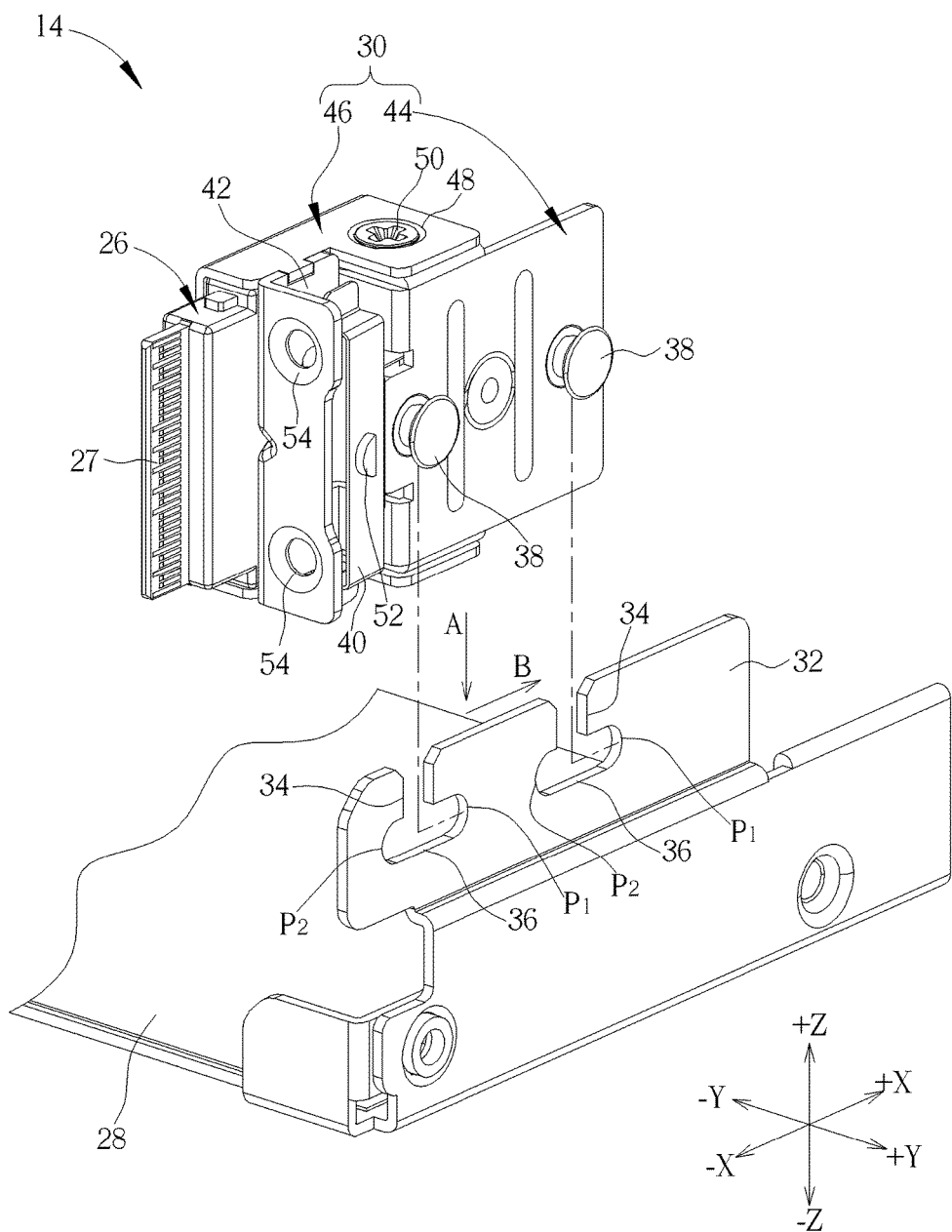
FIG. 5 is an assembly diagram of a pillar of a casing in FIG. 3 being aligned with a longitudinal opening of a side plate.
Figure 6:
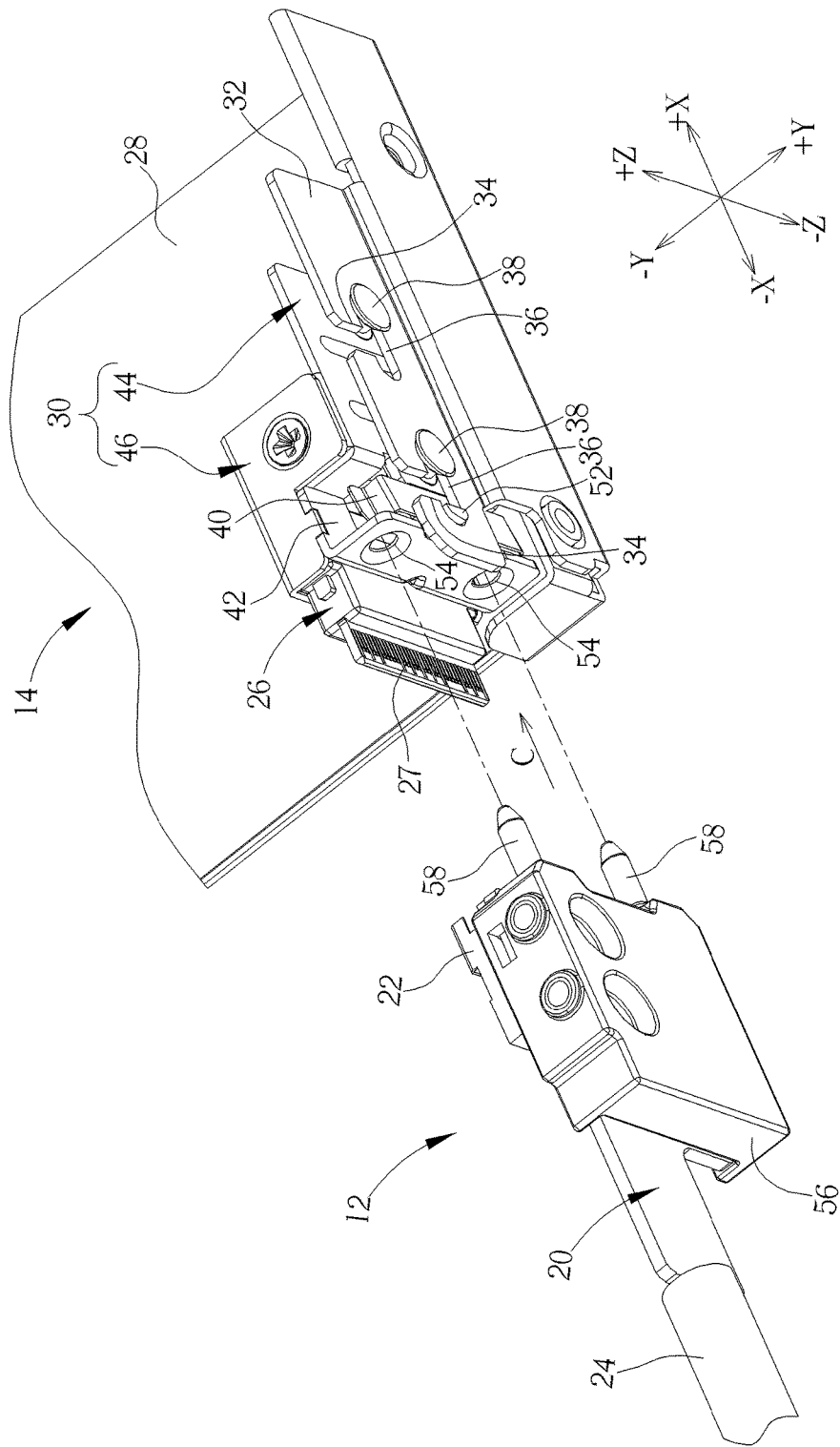
FIG. 6 is an assembly diagram of a guide pin of the connection device in FIG. 2 being aligned with a guide hole of the casing.

The assembly operation of the connection device 12 and the cable limiting device 14 is described in detail as follows. Please refer to FIG. 1, FIG. 5, and FIG. 6. FIG. 5 is an assembly diagram of the pillar 38 of the casing 30 in FIG. 3 being aligned with the longitudinal opening 34 of the side plate 32. FIG. 6 is an assembly diagram of the guide pin 58 of the connection device 12 in FIG. 2 being aligned with the guide hole 54 of the casing 30. When a user want to assemble the connection device 12 with the cable limiting device 14, the user just needs to align the pillar 38 on the casing 30, which has the second cable 26 disposed thereon and coupled to the switchable device 16, with the longitudinal opening 34 on the side plate 32. Subsequently, the user could press the casing 30 to make the pillar 38 pass through the longitudinal opening 34 in an assembly direction A (i.e. a −Z-axis direction as shown in FIG. 5) to enter the transverse slot 36, and then could push the casing 30 toward a rear end $P_1$ of the transverse slot 36 in the transverse slot 36 in an assembly direction B (i.e. a +X-axis direction as shown in FIG. 5).

During the aforesaid process, when the pillar 38 passes through the longitudinal opening 34 to enter the transverse slot 36, the side plate 32 could press the engaging portion 52 to deform the elastic arm 40. Subsequently, when the pillar 38 moves over the sliding travel T as shown in FIG. 1 toward the rear end $P_1$ of the transverse slot 36 in the transverse slot 36 to make the engaging member 52 aligned with the transverse slot 36 (at this time, the pillar 38 abuts against the rear end $P_1$ of the transverse slot 36), the deformed elastic arm 40 could provide an elastic force to make the engaging member 52 spring out of the transverse slot 36 so as to be engaged with a front end $P_2$ of the transverse slot 36. In such a manner, via the two axial limiting design that the pillar 38 abuts against the rear end $P_1$ of the transverse slot 36 and the engaging member 52 is engaged with the front end $P_2$ of the transverse slot 36 for constraining the movement of the casing 30 toward the ±X-axis direction and the ±Z-axis direction as shown in FIG. 1, the casing 30 could be disposed on the side plate 32 steadily, and could only perform the limited movement in the ±Y-axis direction as shown in FIG. 1 relative to the transverse slot 36.

Subsequently, the user could connect the cable limiting device 14 to the connection device 12. That is to say, the user could align the guide pin 58 on the holding base 56 of the connection device 12 with the guide hole 54 on the casing 30, and could push the connection device 12 to make the guide pin 58 inserted into the guide hole 54 on the casing 30 in an assembly direction C (i.e. a +X-axis direction as shown in FIG. 6), so as to guide the gold-plated terminal 27 to be inserted into the port 22 for establishing high speed signal transmission between the switchable device 16 and the motherboard 12 via the bridgeboard 20 and the first cable 24 (as shown in FIG. 1). Furthermore, as mentioned above, via the design that the casing 30 could only perform the limited movement in the ±Y-axis direction relative to the transverse slot 36, the user could flexibly adjust a position of the cable limiting device 14 relative to the connection device 12 during the guide pin 58 is inserted into the guide hole 54 for ensuring that the gold-plated terminal 27 could be inserted into the port 20 smoothly and surely, so as to efficiently prevent damage of components caused by constructive interference between the connection device 12 and the cable limiting device 14 or the connection device 12 directly colliding with the cable limiting device 14.

In such a manner, via the aforesaid simple assembly operation, the present invention could greatly simplify the assembly process of the cable limiting device 14 and the connection device 12. Furthermore, since the present invention utilizes the second cable 26, the bridgeboard 20 spaced from the motherboard 18 and the first cable 24 to establish the high speed signal transmission between the motherboard 18 and the switchable device 16, to replace the prior art design utilizing connection between the board-to-board connector and the middle plane and connection between the middle plane and the cable for establishing signal transmission, not only the high speed wiring layout on the server 10 for the switchable device 16 could be no longer limited to the limited space of the motherboard 18, but also the aforesaid cable connection design could achieve the purpose that the motherboard 18 could utilize the space saved from the aforesaid cable connection design for installation of more other electrical components.

Furthermore, since the conductive performance of the first cable 24 and the second cable 26 (i.e. cables for signal transmission) is more stable and reliable, the high speed signal transmission between the switchable device 16 and the motherboard 18 is not influenced by the lengths of the first cable 24 and the second cable 26. For example, if the first cable 24 and the second cable 26 are used for transmitting mini SAS signals from a north bridge chip on the motherboard 18 to the switchable device 16, the mini SAS signal transmission between the switchable device 16 and the motherboard 18 is not influenced by the lengths of the first cable 24 and the second cable 26. That is, the transmission performance of the first cable 24 and the second cable 26 could meet all demands for line length, line width, line distance, resistance, timing design, electromagnetic interference and so on, of the wiring layout on the motherboard 18. Moreover, since disposal of the first cable 24 and the second cable 26 would not occupy the wiring layout space on the motherboard 18, it is much easier to establish the high speed signal transmission between the switchable device 16 and the motherboard 18. In summary, via the aforesaid cable connection design, the present invention could efficiently improve the design flexibility of the server 10 and reduce the manufacturing cost of the server 10.

Figure 7:
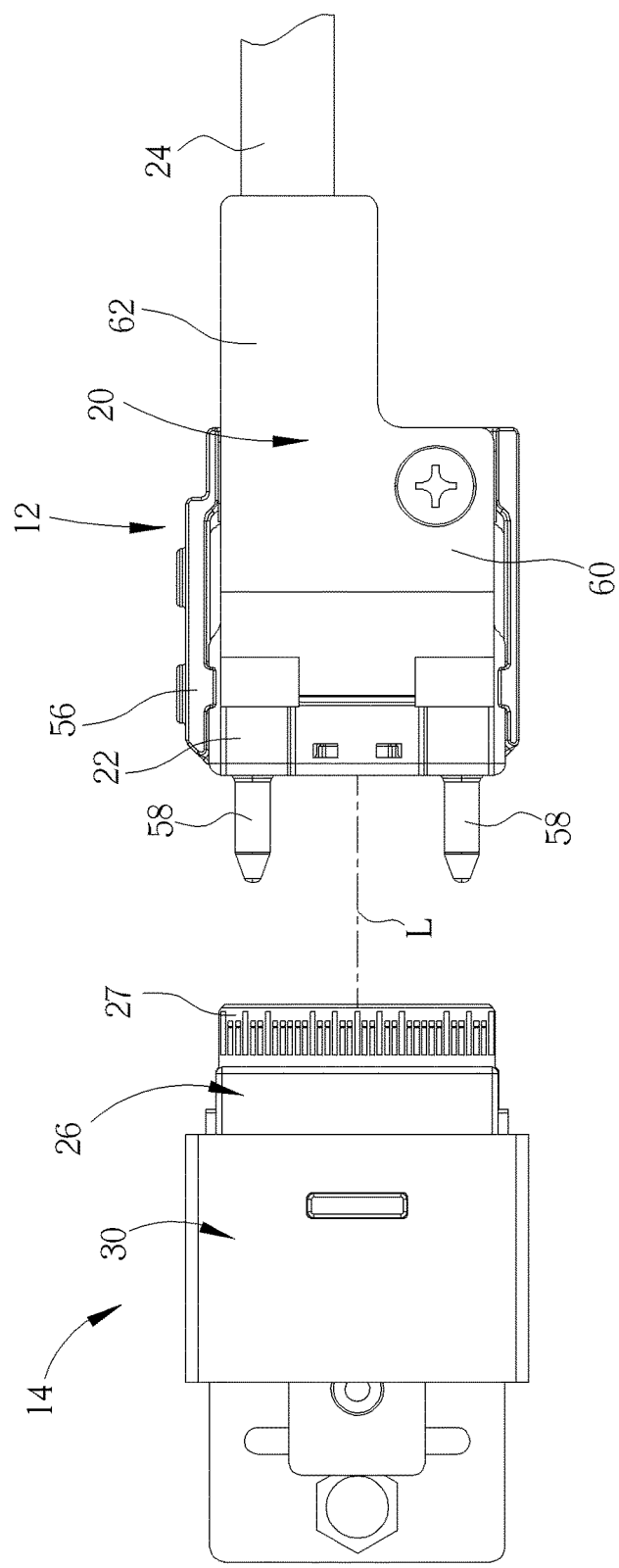
FIG. 7 is a partial side view of the connection device and the cable limiting device in FIG. 6.

It should be mentioned that the present invention could adopt the design that the first cable is non-collinear with a central axis of the gold-plated terminal. Please refer to FIG. 1 and FIG. 7. FIG. 7 is a partial side view of the connection device 12 and the cable limiting device 14 in FIG. 6. As shown in FIG. 7, the first cable 24 is electrically connected to the motherboard 18 and is electrically connected to a position of the bridgeboard 24 non-collinear with a central axis L. For example, in this embodiment, the bridgeboard 24 could have a wide board portion 60 and a narrow board portion 62 extending rearward from the wide board portion 60 to be L-shaped (but not limited thereto). The port 22 is disposed on the wide board portion 60, and the first cable 24 is electrically connected to the narrow board portion 62 to be non-collinear with the central axis L of the gold-plated terminal 27. In such a manner, via the design that the first cable 24 is non-collinear with the central axis L of the gold-plated terminal 27 and the aforesaid design that the casing 30 could only perform the limited movement in the ±Y-axis direction as shown in FIG. 1 relative to the transverse slot 36, the present invention could further prevent the first cable 24 from being broken by frontal impact of the cable limiting device 14 during the connection device 12 is connected to the cable limiting device 14. To be noted, in practical application, the present invention could only adopt the design that the first cable 24 is non-collinear with the central axis L of the gold-plated terminal 27 or the design that the casing 30 could only perform the limited movement in the ±Y-axis direction, for simplifying the structural design of the server 10.

Figure 8:
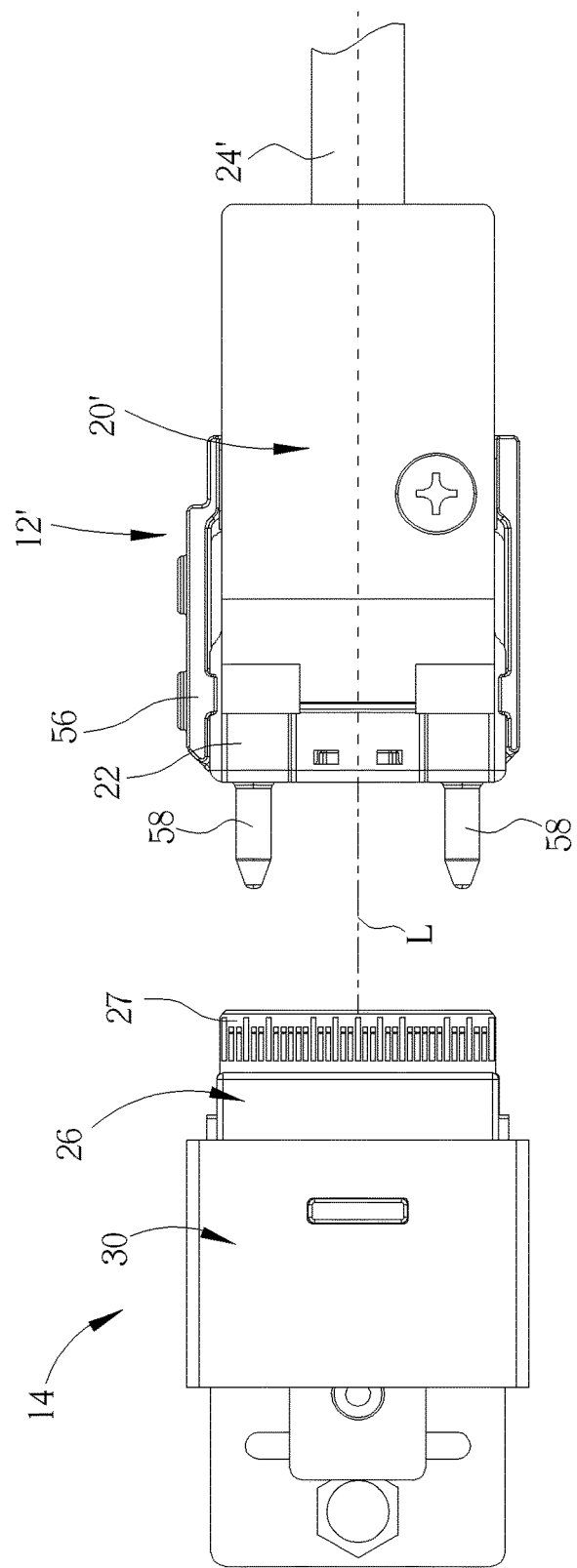
FIG. 8 is a partial side view of a connection device and the cable limiting device according to another embodiment of the present invention.

Moreover, the present invention could adopt the design that the first cable is collinear with the central axis of the gold-plated terminal. For example, please refer to FIG. 1 and FIG. 8. FIG. 8 is a partial side view of a connection device 12' and the cable limiting device 14 according to another embodiment of the present invention. Components both mentioned in this embodiment and the aforesaid embodiment represent components with similar structures or functions. The major difference between this embodiment and the aforesaid embodiment is the connection design of the first cable and the bridgeboard. As shown in FIG. 8, the connection device 12' includes the motherboard 18 (the motherboard 18 is not shown in FIG. 8, and the related description could be referred to FIG. 1 and the aforesaid embodiment), a bridgeboard 20', a port 22, and a first cable 24'. The cable limiting device 14 includes the second cable 26, the tray 28 (the tray 28 is not shown in FIG. 8, and the related description could be referred to FIG. 1 and the aforesaid embodiment), and the casing 30. The first cable 24' is electrically connected to the motherboard 18 and is electrically connected to a position of the bridgeboard 20' collinear with the central axis L of the gold-plated terminal 27. In such a manner, via the aforesaid design that the casing 30 could only perform the limited movement in the ±Y-axis direction as shown in FIG. 1 for providing a connection buffer function, the present invention could prevent the first cable 24' from being broken by frontal impact of the cable limiting device 14 during the connection device 12' is connected to the cable limiting device 14. As for other detailed description for the connection device 12', it could be reasoned by analogy according to the aforesaid embodiments and omitted herein.

Compared with the prior art, the present invention adopts the design that the casing could be close to or away from the side plate via the limiting design of the pillar and the transverse slot, to allow that the user could flexibly adjust a position of the cable limiting device relative to the connection device so as to ensure that the gold-plated terminal could be inserted into the port smoothly and surely. Accordingly, the present invention could efficiently prevent damage of components caused by constructive interference between the connection device and the cable limiting device or the connection device directly colliding with the cable limiting device. In such a manner, via the aforesaid simple assembly operation, the present invention could greatly simplify the assembly process of the cable limiting device and the connection device. Furthermore, since the present invention utilizes the second cable, the bridgeboard spaced from the motherboard, and the first cable to establish the high speed signal transmission between the motherboard and the switchable device, the high speed signal transmission could be no longer influenced by the wiring layout on the motherboard. Moreover, since disposal of the first cable and the second cable would not occupy the wiring layout space on the motherboard, it is much easier to establish the high speed signal transmission between the switchable device and the motherboard, so that the present invention could efficiently improve the design flexibility of the server and reduce the manufacturing cost of the server.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable limiting device for connecting to a connection device of a server, the connection device comprising a motherboard, a bridgeboard, and a port, the port being disposed on the bridgeboard and coupled to the motherboard in a cable connection manner, the cable limiting device comprising:
   a side plate having a longitudinal opening and a transverse slot communicated with the longitudinal opening;
   a casing having a pillar protruding toward a side of the side plate, the pillar passing through the longitudinal opening to be slidably disposed through the transverse slot and be movable relative to the transverse slot for making the casing away from or close to the side plate; and
   a cable fixed in the casing, the cable having a gold-plated terminal;
   wherein when the cable is connected to the port, the casing is away from or close to the side plate with movement of the pillar in the transverse slot for guiding the gold-plated terminal to be inserted into the port and establishing signal transmission via the bridgeboard.

2. The cable limiting device of claim 1, wherein the casing has a containing slot, an elastic arm is formed at a side of the containing slot facing the pillar, an engaging member protrudes from a position of the elastic arm corresponding to the transverse slot, and the engaging member is engaged with a front end of the transverse slot.

3. The cable limiting device of claim 2, wherein the pillar has a sliding travel in the transverse slot, the side plate presses the engaging member to deform the elastic arm when the pillar passes through the longitudinal opening to enter the transverse slot, and the deformed elastic arm provides an elastic force to make the engaging member spring out of the transverse slot so as to be engaged with the front end of the transverse slot when the pillar moves over the sliding travel toward a rear end of the transverse slot in the transverse slot to make the engaging member aligned with the transverse slot.

4. The cable limiting device of claim 2, wherein a plurality of guide holes is formed at a side of the containing slot, and a plurality of guide pins of the connection device passes through the plurality of guide holes respectively for guiding the gold-plated terminal to be inserted into the port when the cable is connected to the port.

5. The cable limiting device of claim 1, wherein the casing comprises a first frame and a second frame, the first frame and the second frame are disposed at two sides of the cable respectively for fixing the cable, and the pillar is formed at a side of the first frame facing the side plate.

6. The cable limiting device of claim 5, wherein two sides of the first frame and two sides of the second frame have a plurality of holes formed thereon respectively, and a plurality of screws is screwed into the holes of the first frame and the holes of the second frame to fix the first frame to the second frame.

7. A server comprising:
   a connection device comprising:
      a motherboard;
      a bridgeboard;
      a port disposed on the bridgeboard; and
      a first cable coupled to the bridgeboard and the motherboard;
   a cable limiting device comprising:
      a tray having at least one side plate, the at least one side plate having a longitudinal opening and a transverse slot communicated with the longitudinal opening;
      a casing having a pillar protruding toward a side of the at least one side plate and an elastic arm formed at a side of the pillar, the pillar passing through the longitudinal opening to be slidably disposed through the transverse slot and be movable relative to the transverse slot for making the casing away from or close to the at least one side plate, the pillar having a sliding travel in the transverse slot, an engaging member protruding from a position of the elastic arm corresponding to the transverse slot, the at least one side plate pressing the engaging member to deform the elastic arm when the pillar passes through the longitudinal opening to enter the transverse slot, and the deformed elastic arm providing an elastic force to make the engaging member spring out of the transverse slot so as to be engaged with a front end of the transverse slot when the pillar moves over the sliding travel toward a rear end of the transverse slot in the transverse slot to make the engaging member aligned with the transverse slot; and
      a second cable fixed in the casing, the second cable having a gold-plated terminal; and
   at least one switchable device disposed on the tray and coupled to the second cable;
   wherein when the second cable is connected to the port, the casing is away from or close to the at least one side plate with movement of the pillar in the transverse slot for guiding the gold-plated terminal to be inserted into the port and establishing signal transmission between the at least one switchable device and the motherboard via the bridgeboard and the first cable.

8. The server of claim 7, wherein the casing has a containing slot, and the elastic arm is formed at a side of the containing slot facing the pillar.

9. The server of claim 8, wherein a plurality of guide holes is formed at a side of the containing slot, the connection device further comprises a holding base for holding the bridgeboard and the port, a plurality of guide pins protrudes from the holding base corresponding to the plurality of guide holes, and the plurality of guide pins passes through the plurality of guide holes respectively for guiding the gold-plated terminal to be inserted into the port when the second cable is connected to the port.

10. The server of claim 7, wherein the casing comprises a first frame and a second frame, the first frame and the second frame are disposed at two sides of the second cable respectively for fixing the second cable, the pillar is formed at a side of the first frame facing the at least one side plate, two sides of the first frame and two sides of the second frame have a plurality of holes formed thereon respectively, and a plurality of screws is screwed into the holes of the first frame and the holes of the second frame to fix the first frame to the second frame.

* * * * *